US007015576B2

(12) United States Patent
Yamane

(10) Patent No.: US 7,015,576 B2
(45) Date of Patent: Mar. 21, 2006

(54) SEMICONDUCTOR DEVICE WHICH PREVENTS LIGHT FROM ENTERING THEREIN

(75) Inventor: Tae Yamane, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/303,906

(22) Filed: Nov. 26, 2002

(65) Prior Publication Data

US 2003/0197270 A1 Oct. 23, 2003

(30) Foreign Application Priority Data

Apr. 18, 2002 (JP) ............................ 2002-116393

(51) Int. Cl.

*H01L 23/552* (2006.01)
*H01L 23/12* (2006.01)
*H01L 23/48* (2006.01)
*H01L 23/52* (2006.01)
*H01L 29/40* (2006.01)

(52) U.S. Cl. ...................... 257/704; 257/659; 257/660; 257/779

(58) Field of Classification Search ................ 257/704, 257/659–660, 779–788
See application file for complete search history.

(56) References Cited

U.S. PATENT DOCUMENTS

2001/0009302 A1 * 7/2001 Murayama et al. ......... 257/704

FOREIGN PATENT DOCUMENTS

JP 11111896 A 4/1999

* cited by examiner

*Primary Examiner*—Cuong Nguyen
(74) *Attorney, Agent, or Firm*—Volentine Francos & Whitt, PLLC

(57) ABSTRACT

A CSP type semiconductor device protects a circuit from the influences exerted by an external light on a circuit. In the CSP type semiconductor device, a light-shielding material, such as a silicone-based resin, an epoxy-based resin, or a metal, is deposited onto a side surface or a rear surface of a semiconductor chip where no circuit is formed.

18 Claims, 3 Drawing Sheets

SEMICONDUCTOR DEVICE WHICH PREVENTS LIGHT FROM ENTERING THEREIN

BACKGROUND OF THE INVENTION

1. Field of the Invention

The present invention relates to a chip size package (CSP) type semiconductor device and a method of fabrication of the same.

2. Description of the Related Art

There are CSP type semiconductor devices designed to achieve a reduced size. In the CSP type semiconductor device, only the surface with a circuit formed thereon of a semiconductor chip is sealed with a resin, and electrodes are installed on the resin-sealed surface. Conventionally, the CSP type semiconductor devices are fabricated by first resin-sealing the circuit-mounted surface of a semiconductor wafer on which a circuit has been formed, then by dicing the semiconductor wafer into individual semiconductor devices.

In the conventional CSP type semiconductor devices, however, the rear surfaces and side surfaces of the semiconductor chips thereof where no circuit has been formed are exposed. This causes light to enter the semiconductor chips through the rear surfaces or side surfaces of the semiconductor chips if the semiconductor chips are mounted in, for example, transparent skeleton type modules. There have been some cases where the light that has entered the semiconductor chip acts on the circuit, adversely affecting the operation of the circuit formed on the semiconductor chip.

SUMMARY OF THE INVENTION

Accordingly, it is an object of the present invention to provide a semiconductor device and a method of fabrication of the same that permit the problem mentioned above to be solved.

To this end, according to one aspect of the present invention, there is provided a semiconductor device including a semiconductor chip having a surface with a circuit formed thereon, a side surface, and a rear surface, and a metal film for blocking light, wherein the metal film covers the side surface and the rear surface of the semiconductor chip.

According to another aspect of the present invention, there is provided a method of fabrication of a semiconductor device including a step for resting a semiconductor wafer having a surface with a circuit formed thereon, a side surface, and a rear surface on a pedestal, such that the surface with the circuit formed thereon opposes the pedestal, a step for cutting the semiconductor wafer, and a step for attaching a light-shielding material to the side surface and the rear surface of the semiconductor wafer.

DESCRIPTION OF THE PREFERRED EMBODIMENTS (First Embodiment)

Figure 1A:
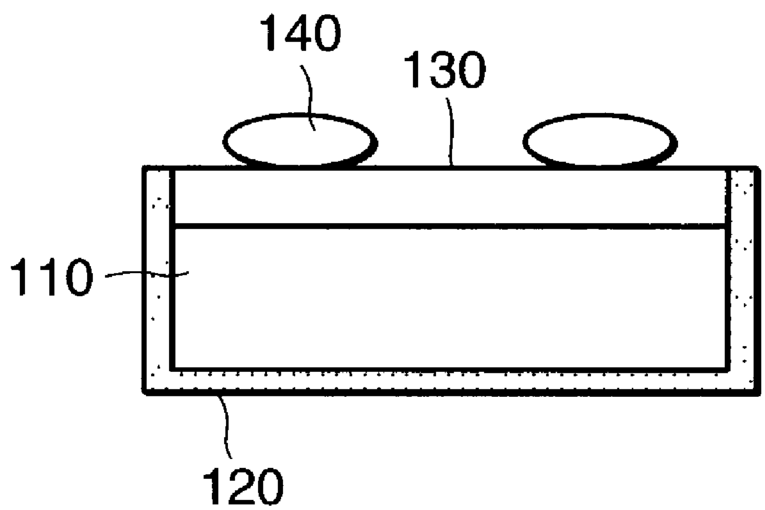
FIGS. 1A and 1B are sectional views showing a first embodiment of the present invention.
Figure 1B:
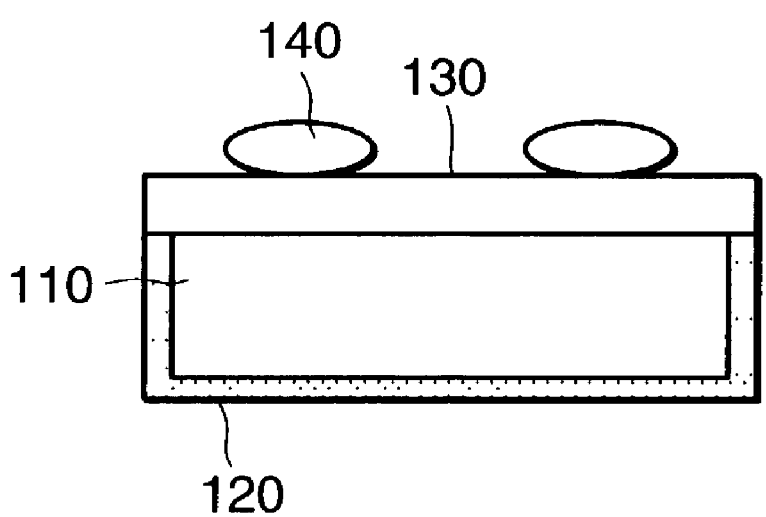

FIG. 1 provides sectional views showing a first embodiment of the present invention. The first embodiment will be described in conjunction with FIGS. 1A and 1B.

Referring to FIG. 1A, the semiconductor device according to the present invention is constructed of a semiconductor chip 110 and a metal film 120 for blocking light. The semiconductor chip 110 has a front surface, a side surface, and a rear surface. There is a circuit (not shown) formed on the front surface of the semiconductor chip, and the circuit is sealed with an opaque resin 130 for blocking light. Furthermore, metal bumps 140 electrically connected with the circuit are formed on the front surface of the semiconductor chip 110 through the intermediary of the resin 130.

The metal film 120 covers the entire rear surface and side surface of the semiconductor chip 110. The metal film 120 is formed of two layers, the layer adjacent to the semiconductor chip 110 being made of a Ti layer or a Ni layer having a thickness of 40 nm or more. A layer made of Au that has a thickness of 200 nm or more covers the Ti layer or the Ni layer.

The first embodiment of the present invention has the aforesaid structure, so that the rear surface and the side surface of the semiconductor chip 110 are covered with the metal film 120. The metal film 120 efficiently blocks light attempting to enter into the semiconductor device from outside, thus preventing the light from entering into the semiconductor chip 110. Thus, the influences of the light on the circuit can be controlled. In particular, according to the present invention, the entire rear surface of the semiconductor chip 110 that has a relatively large area is covered by the metal film 120; therefore, the combination of the metal film 120 and the sealing resin 130 covers all the surfaces of the semiconductor chip 110. With this arrangement, it is possible to shield the semiconductor device from virtually all light coming from any directions.

In place of the metal film 120, an epoxy-based resin film or a silicone-based resin film may be used to cover the semiconductor chip 110. In this case, the epoxy-based resin film or the silicone-based resin film should be capable of blocking light trying to enter into the semiconductor device from outside. The light blocking effect of the films is enhanced especially by adding a pigment, such as carbon, to the epoxy-based resin film or the silicone-based resin film, making it further effective for preventing external light from entering into the semiconductor chip 110.

The relationship between the metal film 120 and the resin 130 may alternatively be the one shown in FIG. 1B to obtain the same advantage as that obtained by the one shown in FIG. 1A.

(Second Embodiment)

FIG. 2 provides sectional views showing a second embodiment of the present invention. The second embodiment of the invention will be described in conjunction with FIG. 2. The second embodiment of the invention is a method for fabricating the semiconductor device shown in FIG. 1A in the first embodiment of the invention.

Figure 2A:
FIGS. 2A through 2F are sectional views showing a second embodiment of the present invention.

Firstly, the surface with a circuit (not shown) formed thereon of a semiconductor wafer 210 having the circuit formed on the front surface thereof is sealed with a resin 230, as shown in FIG. 2A.

Secondly, metal bumps 240 electrically connected to the circuit formed on the front surface of a semiconductor wafer

Figure 2B:
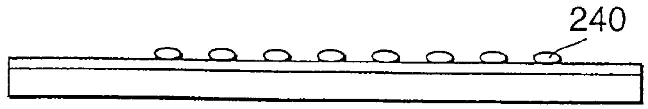

210 are formed on the front surface of the semiconductor wafer 210 through the intermediary of the resin 230, as shown in FIG. 2B. At this time, the metal bumps 240 are not formed around the semiconductor wafer 210.

Figure 2C:

Thirdly, the semiconductor wafer 210 is rested on a pedestal 250 such that the front surface of the semiconductor wafer 210 opposes the pedestal 250, as shown in FIG. 2C. At this time, an adhesive tape 260, such as an electron tape, is provided on the pedestal 250 to fix the semiconductor wafer 210 to the pedestal 250.

Figure 2D:
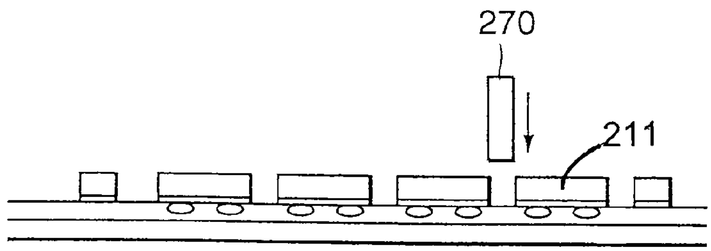

Fourthly, the semiconductor wafer 210 as well as the resin 230 is cut by using a dicing saw 270 to divide the semiconductor wafer 210 into semiconductor chips 211, as shown in FIG. 2D.

Figure 2E:
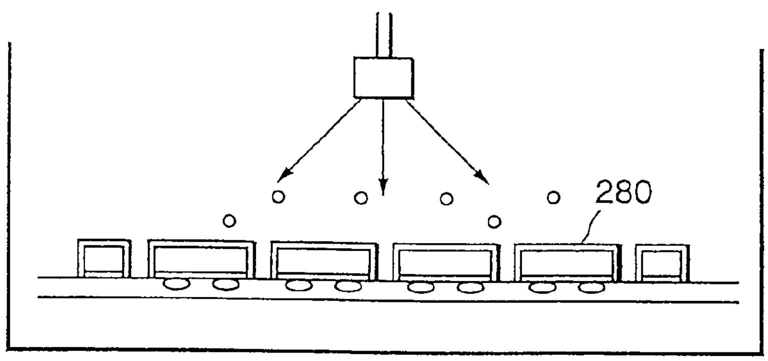

Lastly, an epoxy-based resin or a silicone-based resin 280 is sprayed onto the rear surfaces and the side surfaces of the semiconductor chips 211, as shown in FIG. 2E.

Figure 2F:
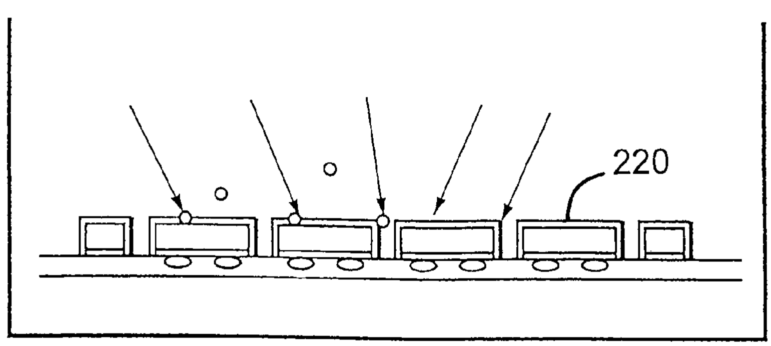

As shown in FIG. 2F, a metal film 220 may be formed by vapor deposition in place of spraying the epoxy-based resin or silicone-based resin 280. The vapor deposition of the metal film 220 is advantageous over the spraying of the epoxy-based resin or silicone-based resin 280 in that the film can be formed to have uniform thickness.

According to the second embodiment of the present invention, the semiconductor wafer 210 is cut on the pedestal 250, so that after the semiconductor wafer 210 is diced into the semiconductor chips 211, the epoxy-based resin or the silicone-based resin 280 is sprayed onto all the semiconductor chips 211 at a time. This permits a simplified fabrication process to be achieved.

(Third Embodiment)

FIG. 3 provides sectional views showing a third embodiment of the present invention. The third embodiment of the invention will be described in conjunction with FIG. 3. The third embodiment of the invention is a method for fabricating the semiconductor device shown in FIG. 1B in the first embodiment of the invention.

Figure 3A:
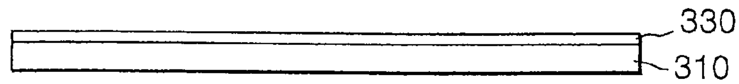
FIGS. 3A through 3G are sectional views showing a third embodiment.

Firstly, the surface with a circuit (not shown) formed thereon of a semiconductor wafer 310 having the circuit formed on the front surface thereof is sealed with a resin 330, as shown in FIG. 3A.

Figure 3B:
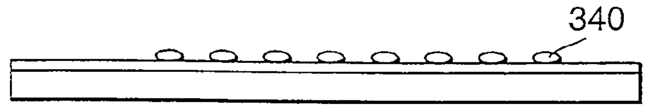

Secondly, metal bumps 340 electrically connected to the circuit formed on the front surface of a semiconductor wafer 310 are formed on the front surface of the semiconductor wafer 310 through the intermediary of the resin 330, as shown in FIG. 3B. At this time, the metal bumps 340 are not formed around the semiconductor wafer 310.

Figure 3C:
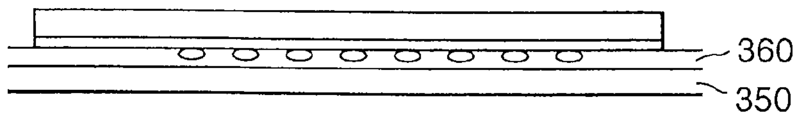

Thirdly, the semiconductor wafer 310 is rested on a pedestal 350 such that the front surface of the semiconductor wafer 310 opposes the pedestal 350, as shown in FIG. 3C. At this time, an adhesive tape 360, such as an electron tape, is provided on the pedestal 350 to fix the semiconductor wafer 310 to the pedestal 350. The steps up to this point are the same as those of the second embodiment.

Figure 3D:
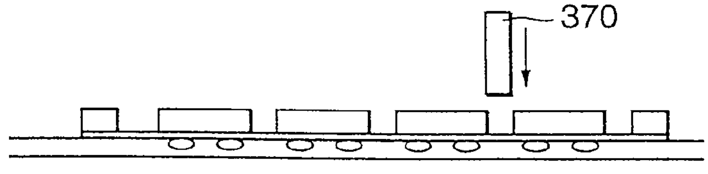

Fourthly, only the semiconductor wafer 310 is cut by using a dicing saw 370. At this time, the resin 330 is not cut, as shown in FIG. 3D.

Figure 3E:
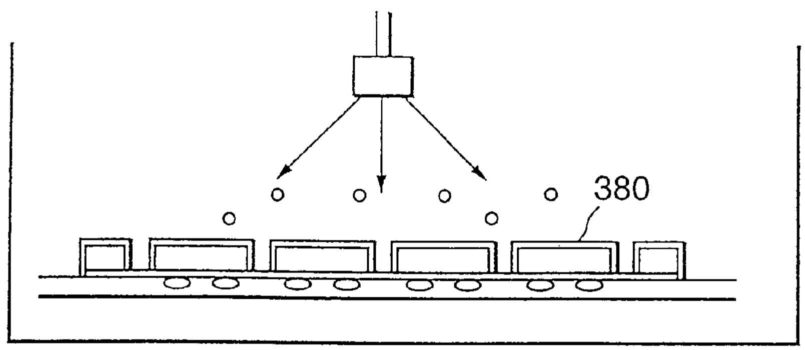

Fifthly, an epoxy-based resin or a silicone-based resin 380 is sprayed onto the rear surface and the side surface of the semiconductor wafer 310, as shown in FIG. 3E.

Figure 3F:
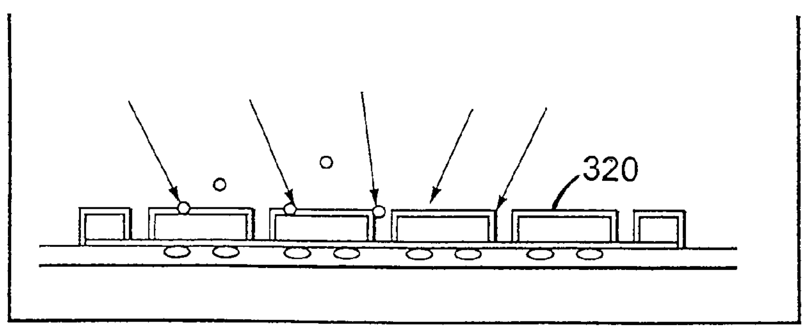

Alternatively, the metal film 320 may be formed by vapor deposition rather than spraying the epoxy-based resin or the silicone-based resin 380, as shown in FIG. 3F. The vapor deposition of the metal film 320 is advantageous over the spraying of the epoxy-based resin or silicone-based resin 380 in that the film can be formed to have uniform thickness.

Although not shown, instead of spraying the epoxy-based resin or the silicone-based resin 380, only the semiconductor wafer 310 may be immersed, while the semiconductor wafer 310 being fixed to the adhesive tape 360, in an epoxy-based resin or a silicone-based resin thereby to make the epoxy-based resin or the silicone-based resin 380 adhere to the semiconductor wafer 310 after dicing only the semiconductor wafer 310.

Figure 3G:
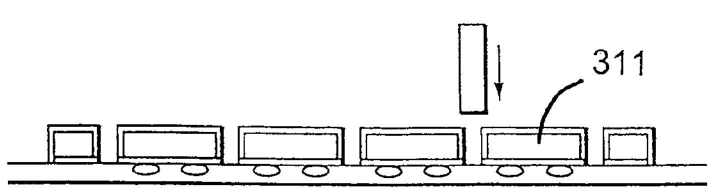

Lastly, the resin 330 is cut by using the dicing saw 370 again to completely divide the semiconductor wafer 310 into semiconductor chips 311, as shown in FIG. 3G.

The third embodiment of the present invention provides the same advantage as that of the second embodiment.

According to the third embodiment of the invention, when the epoxy-based resin or the silicone-based resin 380 is deposited onto the semiconductor wafer 310, the resin 330 formed on the front surface of the semiconductor wafer 310 has not yet been cut. In other words, at this point, the interface between the adhesive tape 360 and the resin 330 is not yet exposed. Hence, when an epoxy-based resin or a silicone-based resin 380 is deposited by immersion, the adherence of the epoxy-based resin or the silicone-based resin 380 to the metal bumps 340 through the interface between the adhesive tape 360 and the resin 330 can be minimized.

As described above, according to the present invention, the rear surface and the side surface of a semiconductor chip are covered by a metal film, an epoxy-based resin, or a silicone-based resin to prevent external light from entering into a semiconductor chip. This arrangement advantageously controls the influences of light on a circuit formed on the semiconductor chip. Moreover, to fabricate semiconductor chips, a metal film, an epoxy-based resin, or a silicone-based resin is deposited onto all semiconductor chips at a time, permitting a simplified fabricating process to be achieved.

What is claimed is:

1. A semiconductor device comprising:

a semiconductor chip having a side surface, a rear surface, and a front surface on which a circuit has been formed;

first and second resin films; and bump electrodes electrically connected to the circuit, the first resin film seals the circuit on the front surface of the semiconductor chip, the second resin film is formed of an epoxy-based resin or a silicone-based resin, blocks light, and is formed in contact with the side surface and the rear surface of the semiconductor chip, and the bump electrode is formed on the first resin film.

2. The semiconductor device according to claim 1, wherein the second resin film is formed in contact with an entirety of the rear surface of the semiconductor chip.

3. The semiconductor device according to claim 1, wherein the second resin film contains a pigment.

4. The semiconductor device according to claim 3, wherein the pigment is carbon.

5. The semiconductor device according to claim 1, wherein the second resin film covers side surfaces of the first resin film.

6. The semiconductor device according to claim 1, wherein side surfaces of the first resin film are exposed.

7. A semiconductor device comprising:

a first main surface on which circuit elements have been formed;

a second main surface substantially opposing the first main surface;

a semiconductor substrate having a plurality of side surfaces between the first main surface and the second main surface;

a first resin film covering the circuit elements on the first main surface;

a plurality of external terminals that are electrically connected to the circuit elements and project from a front surface of the first resin film; and a second resin film that is formed in contact with the side surfaces of the semiconductor substrate and the second main surface, blocks light, and is formed of an epoxy-based resin or a silicone-based resin.

8. The semiconductor device according to claim 7, wherein the second resin film is formed in contact with an entirety of the second main surface of the semiconductor substrate.

9. The semiconductor device according to claim 7, wherein the second resin film contains a pigment.

10. The semiconductor device according to claim 9, wherein the pigment is carbon.

11. The semiconductor device according to claim 7, wherein the second resin film covers side surfaces of the first resin film.

12. The semiconductor device according to claim 7, wherein side surfaces of the first resin film are exposed.

13. A semiconductor device comprising:

a semiconductor chip having a first main surface on which a circuit is formed, and a second main surface opposite the first main surface;

a first resin film coated on the first main surface of the semiconductor chip, that seals the circuit and the first main surface of the semiconductor chip;

external terminals formed on the first resin film and electrically coupled to the circuit through the first resin film; and a second resin film formed of an epoxy-based or silicone-based resin, that is coated on the second main surface and side surfaces of the semiconductor chip so as to be in contact with the side surfaces and that blocks light from reaching the semiconductor chip, the first and second resin films are opaque.

14. The semiconductor device according to claim 13, wherein the second resin film is coated so as to be in contact with an entirety of the second main surface of the semiconductor chip.

15. The semiconductor device according to claim 13, wherein the second resin film contains a pigment.

16. The semiconductor device according to claim 15, wherein the pigment is carbon.

17. The semiconductor device according to claim 13, wherein the second resin film covers side surfaces of the first resin film.

18. The semiconductor device according to claim 13, wherein side surfaces of the first resin film are exposed.

* * * * *